(12) United States Patent
Boughton et al.

(10) Patent No.: US 10,450,648 B2
(45) Date of Patent: Oct. 22, 2019

(54) APPARATUS AND METHOD TO COAT GLASS SUBSTRATES WITH ELECTROSTATIC CHUCK AND VAN DER WAALS FORCES

(71) Applicant: CORNING INCORPORATED, Corning, NY (US)

(72) Inventors: Daniel Robert Boughton, Naples, NY (US); James Gerard Fagan, Painted Post, NY (US); Sumalee Likitvanichkul Fagan, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/197,466

(22) Filed: Nov. 21, 2018

(65) Prior Publication Data

US 2019/0085443 A1    Mar. 21, 2019

Related U.S. Application Data

(62) Division of application No. 15/673,979, filed on Aug. 10, 2017, now Pat. No. 10,138,546.
(Continued)

(51) Int. Cl.
*H02N 13/00* (2006.01)
*C23C 14/50* (2006.01)
(Continued)

(52) U.S. Cl.
CPC ............ *C23C 14/50* (2013.01); *C03C 17/002* (2013.01); *C03C 23/0075* (2013.01);
(Continued)

(58) Field of Classification Search
CPC ....... C23C 14/50; C23C 14/24; C03C 17/002; C03C 23/0075; H02N 13/00
See application file for complete search history.

(56) References Cited

U.S. PATENT DOCUMENTS 5,055,964 A * 10/1991 Logan ................. H01L 21/6831
                                                              279/128
5,812,362 A *  9/1998 Ravi .................... H01L 21/6831
                                                              279/128
(Continued)

FOREIGN PATENT DOCUMENTS

WO     WO 99/65136    * 12/1999    ............ H02N 13/00
WO     2017117330 A1    7/2017

OTHER PUBLICATIONS

Lee, B.K., et al., "Dense Yttria Film Deposited on a Plasma-Sprayed Al2O3 Coating by Aerosol Deposition". J. Ceram. Sci. Tech., 02[04] 197-202 (2011).*
(Continued)

*Primary Examiner* — Bret P Chen

(57) ABSTRACT

A chucking apparatus and methods for coating a glass substrate using a vacuum deposition process are disclosed. In one or more embodiments, the chucking apparatus includes an ESC (ESC), a carrier disposed on the ESC, wherein the carrier comprises a first surface adjacent to the ESC and an opposing second surface for forming a Van der Waals bond with a third surface of a glass substrate, without application of a mechanical force on a fourth surface of the glass substrate opposing the third surface. In one or more embodiments, the method includes disposing a carrier and a glass substrate on an ESC, such that the carrier is between the glass substrate and the ESC to form a chucking assembly, forming a Van der Waals bond between the carrier and the glass substrate, and vacuum depositing a coating on the glass substrate.

5 Claims, 10 Drawing Sheets

Related U.S. Application Data

(60) Provisional application No. 62/373,037, filed on Aug. 10, 2016.

(51) Int. Cl.

| | | |
|---|---|---|
| *C23C 14/24* | (2006.01) | |
| *C03C 17/00* | (2006.01) | |
| *C03C 23/00* | (2006.01) | |
| *C03C 27/06* | (2006.01) | |
| *H01L 21/67* | (2006.01) | |
| *H01L 21/683* | (2006.01) | |
| *H01L 21/687* | (2006.01) | |

(52) U.S. Cl.
CPC ............ *C03C 27/06* (2013.01); *C23C 14/24* (2013.01); *H01L 21/6715* (2013.01); *H01L 21/6831* (2013.01); *H01L 21/68785* (2013.01); *H02N 13/00* (2013.01); *C03C 2218/30* (2013.01)

(56) References Cited

U.S. PATENT DOCUMENTS

| | | | |
|---|---|---|---|
| 9,028,628 B2 | 5/2015 | Lin et al. | |
| 9,601,363 B2 | 3/2017 | Wiltsche et al. | |
| 10,138,546 B2* | 11/2018 | Boughton | C23C 14/24 |
| 2002/0109955 A1* | 8/2002 | Masuda | H01L 21/6833 361/234 |
| 2003/0079823 A1 | 5/2003 | Sabia | |
| 2006/0028508 A1 | 2/2006 | Chen et al. | |
| 2006/0158822 A1 | 7/2006 | Kondo et al. | |
| 2008/0266747 A1 | 10/2008 | Shiraiwa et al. | |
| 2010/0275990 A1* | 11/2010 | Shimomura | H01L 31/022425 136/256 |
| 2012/0052690 A1 | 3/2012 | Belostotskiy et al. | |
| 2012/0299175 A1* | 11/2012 | Tran | B82Y 10/00 257/712 |
| 2012/0321999 A1* | 12/2012 | Mitsumori | G03F 1/24 430/5 |
| 2013/0105087 A1 | 5/2013 | Cho et al. | |
| 2014/0036404 A1 | 2/2014 | Prahlad et al. | |
| 2014/0071581 A1 | 3/2014 | Haas et al. | |
| 2014/0141560 A1* | 5/2014 | Maekawa | H01L 27/14632 438/64 |
| 2014/0170378 A1 | 6/2014 | Bellman et al. | |
| 2014/0318697 A1 | 10/2014 | Tan et al. | |
| 2015/0099110 A1 | 4/2015 | Bellman et al. | |
| 2015/0288302 A1 | 10/2015 | Tatsumi et al. | |
| 2016/0237563 A1* | 8/2016 | Sieber | C23C 16/4584 |
| 2017/0362698 A1* | 12/2017 | Kobayashi | C23C 16/04 |
| 2018/0258519 A1* | 9/2018 | White | H01L 21/203 |

OTHER PUBLICATIONS

Hayes, A.V., et al., "Evalation of backside particle contamination and electrostatic chuck design on the cleanliness of EUV reticle mask blanks in a multilayer Mo/Si ion beam deposition system". Proc. SPIE 7122, Photomask Technology 2008, 71223) (Oct. 17, 2008), pp. 1-16.*

International Search Report and Written Opinion of the International Searching Authority; PCT/US2017/046254; dated Oct. 20, 2017; 12 Pages; European Patent Office.

Niklaus et al; "Adhesive Wafer Bonding"; Journal of Applied Physics, 99, 031101 (2006); 29 Pages.

Berengueres, Jose, et al., "Structural properties of a scaled gecko foot-hair". Bioinspiration & Biomimetics, 2 (2007), pp. 1-8.

Hashiguchi, Hideto, et al., "Self-Assembled and Electrostatic Carrier Technology for Via-Last TSV Formation Using Transfer Stacking-Based Chip-to-Wafer 3-D Integration". IEEE Transactions on Electron Devices, vol. 64, No. 12, Dec. 2017, pp. 5065-5072.

Bock, K., et al., "Characterization of electrostatic carrier substrates to be used as a support for thin semiconductor wafers". 2005, pp. 1-8. No other citation information available.

Risse, Stefan, et al., "Ultra-Planar Electrostatic Chucks base on Low CTE Materials for Lithography and Metrology". Paper No. 2867 24th Annual Meeting ASPE, pp. 1-4. No date or citation information available.

* cited by examiner

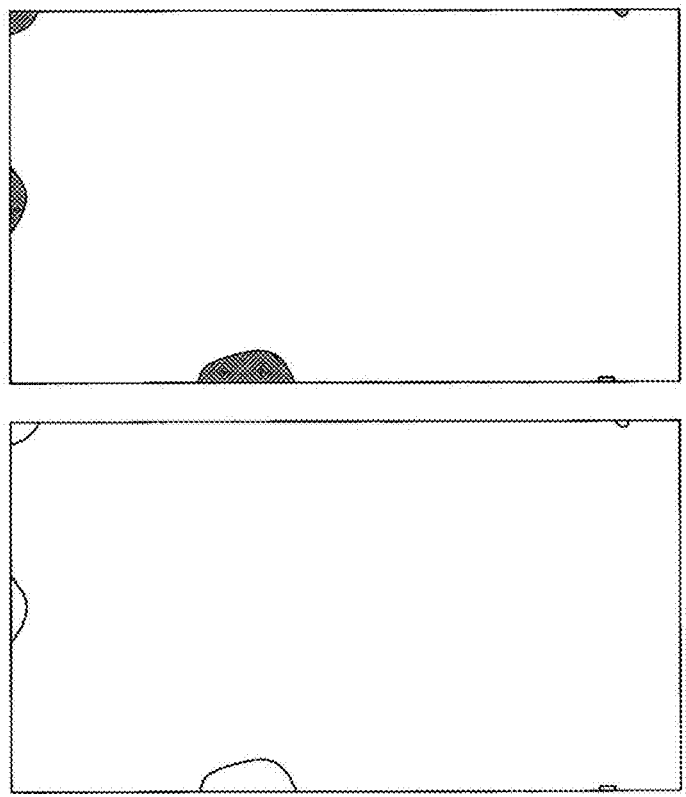

APPARATUS AND METHOD TO COAT GLASS SUBSTRATES WITH ELECTROSTATIC CHUCK AND VAN DER WAALS FORCES

CROSS-REFERENCE TO RELATED APPLICATIONS

This application is a divisional application and claims the benefit of priority under 35 U.S.C. § 120 of U.S. application Ser. No. 15/673,979 filed on Aug. 10, 2017 now U.S. Pat. No. 10,138,546, which in turn, claims the benefit of priority under 35 U.S.C. § 119 of U.S. Provisional Application Ser. No. 62/373,037 filed on Aug. 10, 2016, the contents of each of which are relied upon and incorporated herein by reference in their entireties.

BACKGROUND OF THE INVENTION

The present disclosure relates to an apparatus and method for coating substrates using an ESC and Van der Waals forces.

Handheld display glass with surface treatments is being developed to meet market demands, and such surface treatments include antimicrobial surface treatments and scratch resistant optical coatings. There exists a need for the combination of low manufacturing cost and rapid delivery of such handheld displays and therefore a low-cost, high-volume manufacturing process for producing high performance scratch-resistant optical coatings is desired for both 2D and 3D glass substrates. Such manufacturing processes include vacuum deposition processes in which the substrates reach a relatively high processing temperature due to particle kinetics over the process duration (e.g., up to or even exceeding 230° C.), which makes clamping the substrates difficult with conventional techniques, such as adhesive tapes.

The use of adhesive tapes to secure substrate for coating in those processes utilizing a vacuum deposition process involves three distinct disadvantages: (1) the taping process is labor intensive and increases the time to set up the substrates for each subsequent run and (2) the adhesive outgases in the pristine plasma environment resulting in contamination, requiring vacuum deposition chambers to be cleaned periodically which, turn adds more cost and time to the process, and, (3) the adhesive leaves residue on the coated substrate, which requires additional handling and cleaning post-coating, also adding further costs and time to the process.

Several methods to bond substrates temporarily for vacuum deposition processing have been tried in industry without significant success. These methods include the use of glass-to-glass Van der Waals bonding, the use of adhesive bonding using various adhesive compositions, and the use of polymeric coatings on the substrate surface to change the surface energy resulting in a temporary bond remaining strong enough for the contemplated end process but weak enough to de-bond once the process is complete. To initiate a Van der Waals bond between a glass carrier and a glass substrate typically requires firm and uniform pressure over the entire contact area. It is not desirable in the production process to apply such forces or to even contact the substrate surface to be coated since this action directly impacts the resulting coating quality.

Accordingly, it can be seen that a need remains for a satisfactory low-cost technique for attaching glass substrates in vacuum deposition chambers for coating using a vacuum deposition process.

SUMMARY OF THE INVENTION

A first aspect of this disclosure pertains to a chucking apparatus for temporarily chucking a cover glass to a carrier. In one or more embodiments, the apparatus includes an electrostatic chuck (ESC), and a carrier disposed on the ESC. In one or more embodiments, the carrier includes a first surface adjacent to the ESC and an opposing second surface for forming a Van der Waals bond with a (third) surface of a glass substrate, without application of a mechanical force on the glass substrate an opposing (fourth) surface of the glass substrate. In one or more embodiments, the carrier may include glass, glass-ceramic, ceramic, silicon wafer, metal, or other suitable material.

In one or more embodiments, the ESC and the carrier are adapted to form a Van der Waals bond between the carrier and a glass substrate without application of a mechanical force on the glass substrate.

In some embodiments, the ESC is adapted to apply a clamping force in a range from about 3 gf/cm$^2$ and 10 gf/cm$^2$.

In one or more embodiments, the chucking apparatus includes a glass substrate with a first coefficient of thermal expansion and the carrier comprises a second coefficient of thermal expansion that is within 10% of the first coefficient of thermal expansion.

A second aspect of this disclosure pertains to a method of vacuum depositing a coating on a surface of a glass substrate. In one or more embodiments, the method includes disposing a carrier and a glass substrate on an ESC, such that the carrier is between the glass substrate and the ESC to form a chucking assembly, forming a Van der Waals bond between the carrier and the glass substrate, and vacuum depositing a coating on the glass substrate. In one or more embodiments, the carrier includes opposing first and second surfaces, and the glass substrate includes opposing third and fourth surfaces, and wherein the Van der Waals bond is formed between the second surface and the third surface.

In one or more embodiments, forming the Van der Waals bond comprises energizing the ESC to secure the glass substrate to the carrier, and to secure the carrier to the ESC. In one or more embodiments, the ESC is energized with an electric voltage in a range from about 500 volts DC to about 3500 volts DC. In some instances, forming the Van der Waals bond comprises energizing the ESC to apply a clamping force to the chucking assembly in a range from about 3 gf/cm$^2$ and 10 gf/cm$^2$.

In one or more embodiments, the method includes forming the Van der Waals bond without application of a mechanical force on the fourth surface. In one or more specific embodiments, the method includes forming the Van der Waals bond without applying a mechanically force to the glass substrate.

In one or more specific embodiments, forming the Van der Waals bond comprises cleaning the second surface and the third surface. In some instances, the second surface is cleaned before disposing the carrier and the glass substrate on the ESC. In other instances, the carrier is disposed on the ESC and the glass substrate is sequentially disposed on the carrier, and wherein the second surface is cleaned after disposing the carrier on the ESC and before the glass substrate is placed on the carrier.

In one or more embodiments, the method includes de-energizing the ESC; and removing the Van der Waals-bonded cover glass and carrier from the ESC.

In one or more embodiments, the Van der Waals bond comprises a bond strength in a range from about 100 mg/cm² and 700 mg/cm². In some instances, the second surface comprises a surface roughness of less than about 0.6 nanometers and a flatness of less than 60 micrometers, over an area having dimensions of 1 mm by 1 mm, and the third surface comprises a flatness of less than 80 micrometers, over an area having dimensions of 1 mm by 1 mm.

In one or more embodiments, the chucking assembly is disposed on a carrier plate and the carrier plate is disposed in a vacuum deposition chamber. In some instances, the carrier plate comprises a plurality of chucking assemblies.

BRIEF DESCRIPTION OF THE DRAWING FIGURES

FIGS. 9A and 9B are illustrations of experimental test results showing the extent of Van der Waals bonding, with dark regions in FIG. 9B depicting non-bonded regions.

DETAILED DESCRIPTION

Figure 1:
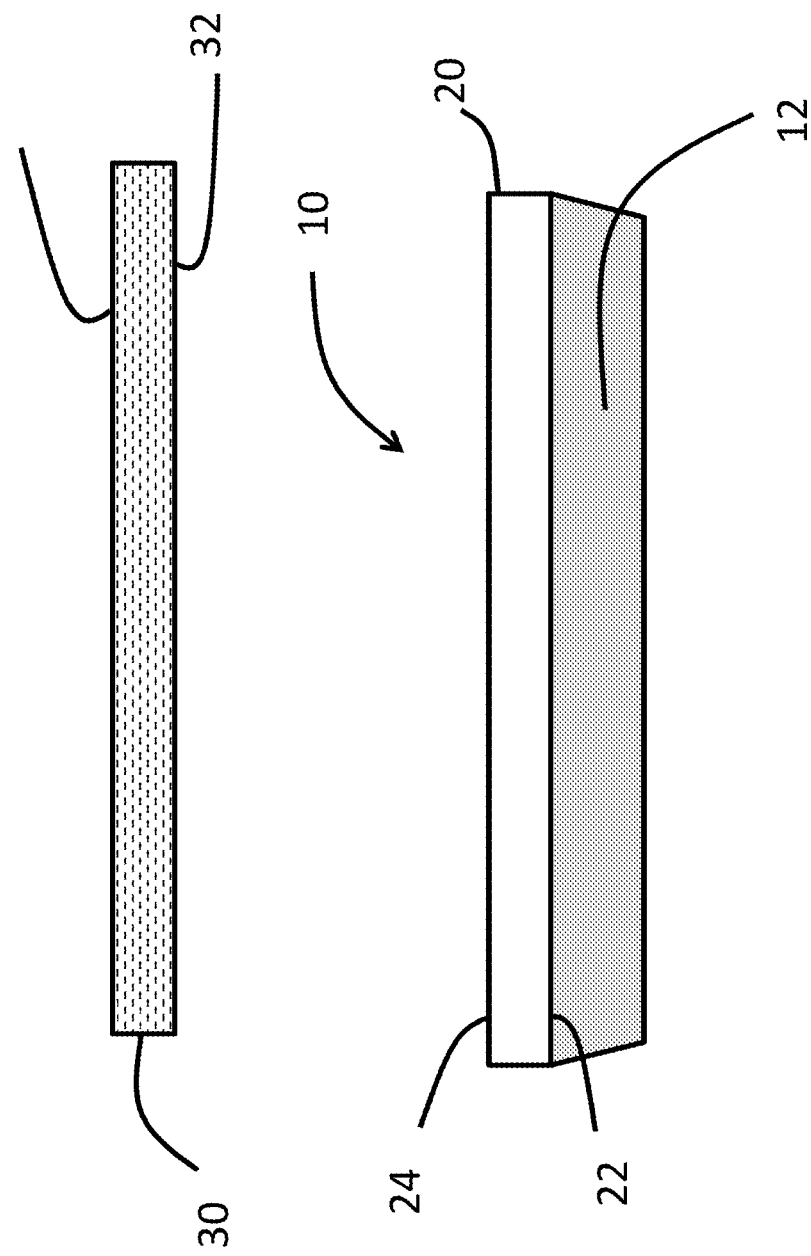
FIG. 1 is a side view the chucking apparatus according to one or more embodiments.

Referring now in detail to the various drawing figures, in which like reference characters represent like parts throughout the several views, the Figures generally depict a chucking apparatus and method for coating a substrate using the chucking apparatus using a vacuum deposition process in a vacuum deposition chamber. The method uses a chucking apparatus (as will be described herein) to electrostatically secure a carrier to an ESC and a glass substrate to the carrier, and to form a Van der Waals bond between the carrier and the glass substrate without application of a mechanical force on the surface of the glass substrate on which the coating is to be deposited.

The chucking apparatus and the methods described herein enable coating a pristine surface of a glass substrate using a vacuum deposition process. The chucking apparatus and method also provide a consistent and uniform pressure which can be set to a value that provides the right level of bond energy for retention and debonding once the vacuum deposition process is completed. The chucking apparatus and method also reduce the labor and time required to secure glass substrates in a vacuum deposition chamber for coating and reduces the handling of such glass substrates, since the method can largely be automated.

A first aspect of this disclosure pertains to a chucking apparatus for temporarily chucking a cover glass to a carrier. Referring to FIGS. 1-5, the chucking apparatus 10 includes an ESC 12, and a carrier 20 disposed on the ESC. The carrier 20 includes a first surface 22 and an opposing second surface 24, where the first surface 22 is adjacent to the ESC. In some embodiments, the first surface 22 is in direct contact with the ESC. The second surface 24 is adapted to or configured to form a Van der Waals bond with glass substrate 30. As shown in FIG. 1, the glass substrate 30 includes a third surface 32 and an opposing fourth surface 34. When the carrier and the glass substrate are assembled, the Van der Waals bond is formed between the second surface 16 and the third surface 32, without application of a mechanical force on a fourth surface 34 of the glass substrate. In one or more embodiments, after assembly (as described herein) the Van der Waals bond is formed without application of a mechanical force on the glass substrate (or more particularly on the fourth surface 34 of the glass substrate). In one or more embodiments, one or both the glass substrate and the carrier are modified or treated to facilitate formation of the Van der Waals bond. For example, one or both the second surface and the third surface includes a surface roughness (Ra and Rq) of less than about 0.6 nanometers (e.g., less than about 0.55 nm, less than about 0.5 nm, less than about 0.45 nm, less than about 0.4 nm), over an area having dimensions of 1 mm by 1 mm. The lower limit of the surface roughness may be about 0.1 nm or 0.2 nm.

In some embodiments, the second surface may include a flatness of less than 60 micrometers (e.g., 55 micrometers or less, 50 micrometers or less, 45 micrometers or less, or about 40 micrometers or less), over an area having dimensions of 1 mm by 1 mm. The lower limit of flatness may be about 10 micrometers or 20 micrometers.

In one or more embodiments, the third surface may include a flatness of less than 80 micrometers (e.g., less than about 75 micrometers, less than about 70 micrometers, or less than about 60 micrometers), over an area having dimensions of 1 mm by 1 mm. The lower limit of flatness for the second surface and the third surface may be about 20 nanometers, or 10 nanometers.

In one or more embodiments, the ESC is adapted to apply a clamping force in a range from about 3 gf/cm² and 10 gf/cm².

The chucking apparatus may include a glass substrate (as described herein). In such embodiments, the glass substrate has a first coefficient of thermal expansion and the carrier comprises a second coefficient of thermal expansion that is within 10% of the first coefficient of thermal expansion. In some instances, the first coefficient of thermal expansion and the second coefficient of thermal expansion are substantially equal.

Figure 2:
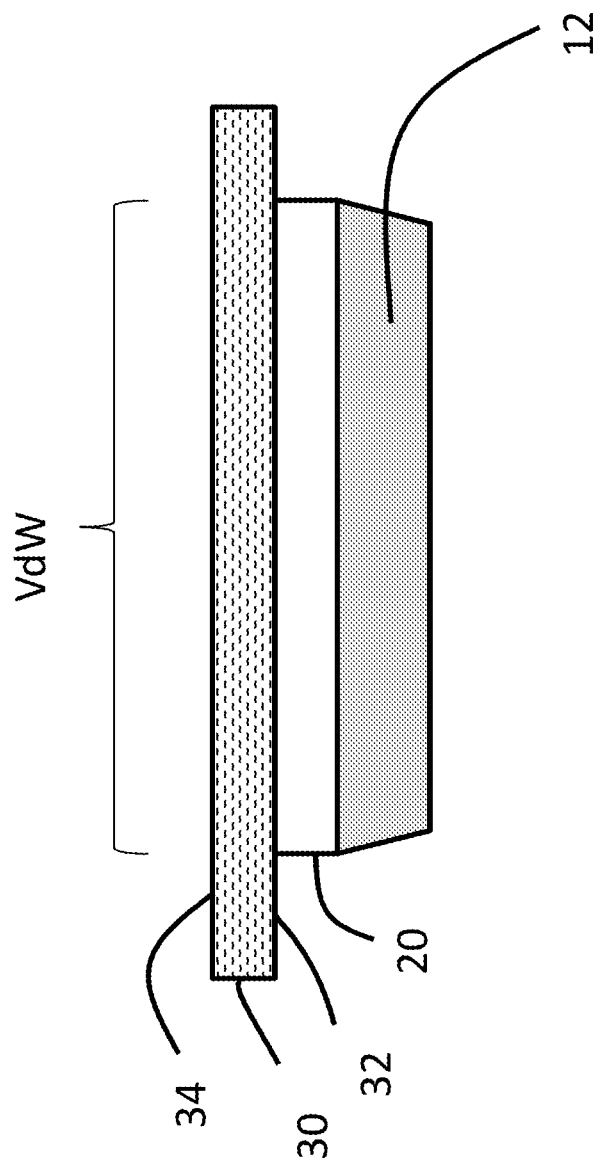
FIG. 2 is a side view the chucking apparatus according to one or more embodiments.
Figure 3:
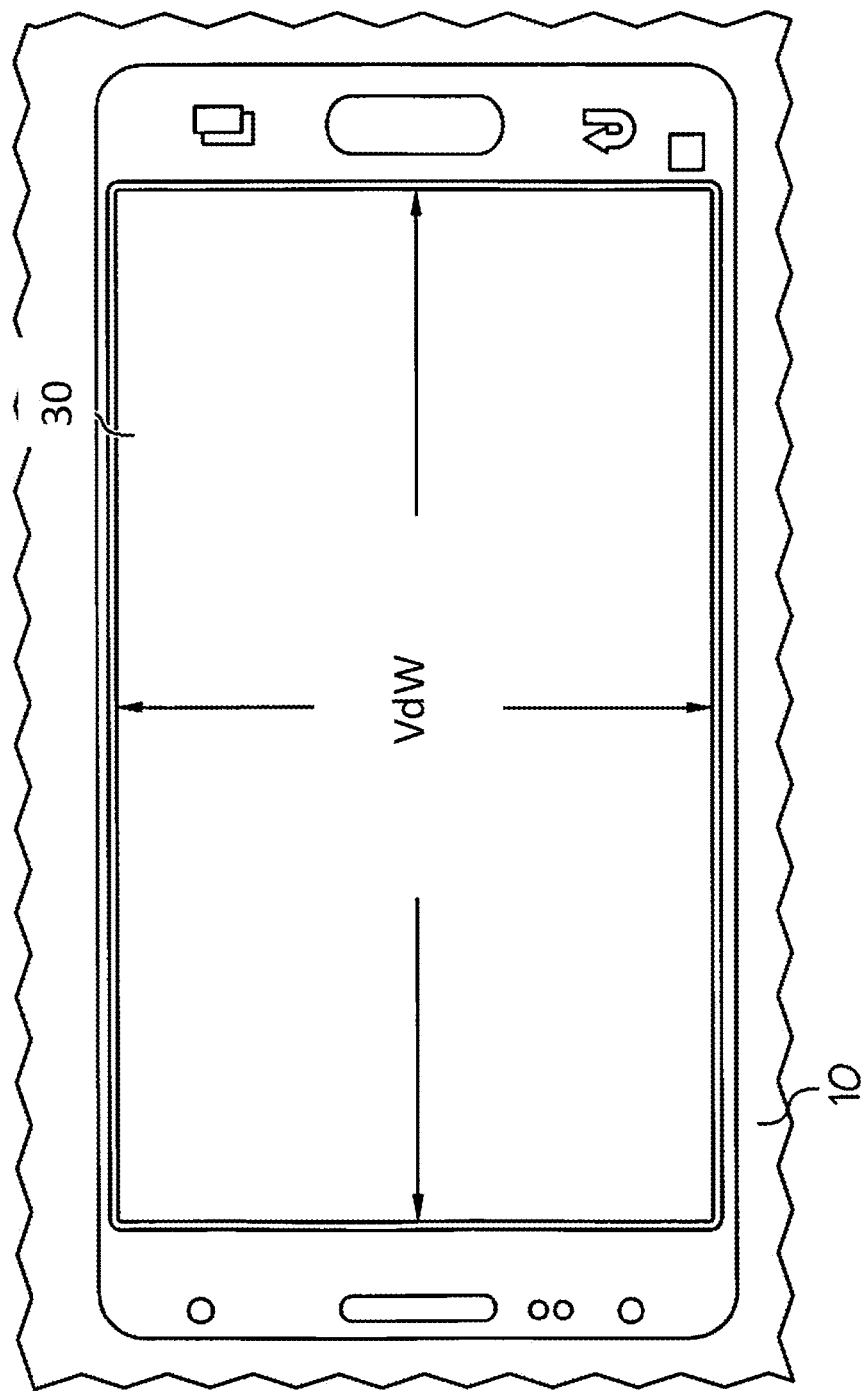
FIG. 3 is a schematic illustration of a plurality of chucking apparatuses for coating glass substrates in a vacuum deposition chamber using a vacuum deposition process, according to one or more embodiments.
Figure 4:
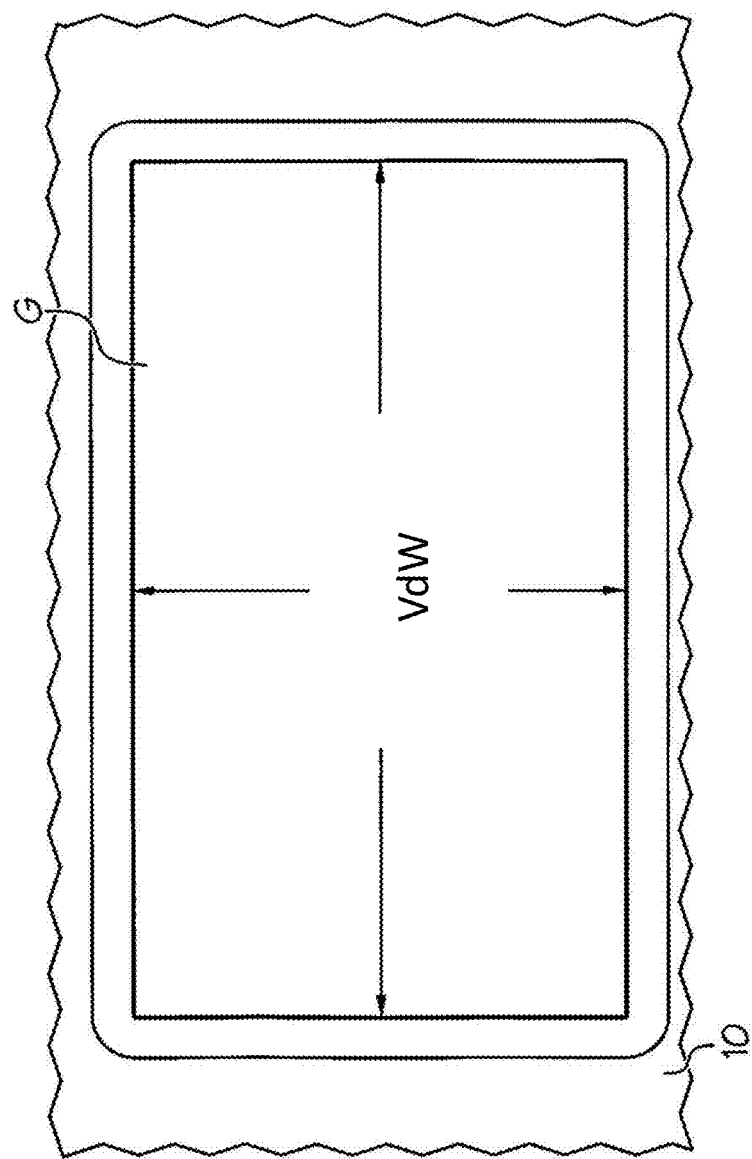
FIG. 4 is a front plan view illustration of the chucking apparatus of FIG. 3, with a 2D glass substrate mounted thereon.

As shown in FIG. 2, the carrier 20 may cover only a portion of the glass substrate. As illustrated in FIGS. 3-4, the area over which the Van der Waals bond (VdW) is formed may cover only a portion of the total area of the glass substrate 30.

The glass substrate may have a flat or planar shape (2D), as shown in FIG. 3, or may be curved or shaped (3D) as shown in FIG. 4. The area over which the Van der Waals bond (VdW) is formed are indicated in FIGS. 3-4 and comprises only a portion of the total area of the glass substrate. In some embodiments, the Van der Waals bond may be formed over the entirety of the glass substrate area.

Where a 3D glass substrate is used, the area over which the Van der Waals bond is formed may comprise a portion or the entirety of the substantially flat (or planar) portion of the glass substrate, as shown in FIG. 4. In one or more embodiments, the carrier may have a thickness in a range from about 0.5 mm to about 4 mm (e.g., from about 0.55 mm to about 4 mm, from about 0.6 mm to about 4 mm, from about 0.65 mm to about 4 mm, from about 0.7 mm to about 4 mm, from about 0.75 mm to about 4 mm, from about 0.8 mm to about 4 mm, from about 0.9 mm to about 4 mm, from about 1 mm to about 4 mm, from about 1.1 mm to about 4 mm, from about 1.2 mm to about 4 mm, from about 1.5 mm to about 4 mm, from about 0.5 mm to about 3.5 mm, from about 0.5 mm to about 3 mm, from about 0.5 mm to about 2.5 mm, from about 0.5 mm to about 2 mm, from about 0.5 mm to about 1.5 mm, from about 0.5 mm to about 1.1 mm, or from about 0.7 mm to about 1.1 mm).

In one or more embodiments, the thickness (and mass) the carrier is selected to enable retention by an ESC, but to prevent the carrier from operating as an effective heat sink (which would result in a permanent bond between it and the glass substrate at process temperatures). Due to its low mass, the carrier 20, even at an elevated temperature, does not experience this permanent bonding effect when assembled with a glass substrate. The mass of the carrier may be in a range of 6 to 8 grams.

The carrier 20 described in this invention has a particular glass composition with similar CTE (coefficient of thermal expansion) closely matched to that of the glass substrate 30. In one or more embodiments, the difference in CTE of the carrier and the glass substrate differ by 10% at most. A substantial CTE differential between the glass substrate 30 and the carrier 20 will cause different rates of thermal expansion between the carrier and the glass substrate and could result in bowing of one or the other as the process temperature increases. Thus, the CTE of the glass substrate and the carrier preferably are chosen to be numerically close to one another. One way to accomplish this easily is to make the carrier with a glass composition that is substantially similar or even identical to the glass composition of the glass substrate.

In one or more embodiments, the carrier and the glass substrate comprise soda lime glass, alkali aluminosilicate glass, alkali containing borosilicate glass and alkali aluminoborosilicate glass. Those skilled in the art will recognize that other glass substrate compositions can be used with the present invention.

In Table 1 are exemplary glasses for use as a carrier and a glass substrate. The CTE value is an average value between room temperature and 300° C. Coefficient of thermal expansion (CTE) is characterized by methods known to those in the art, such as, those described in ASTM E228 (and its progeny, all herein incorporated by reference) Standard Test Method for Linear Thermal Expansion of Solid Materials with a Push-Rod Dilatometer," ASTM International, Conshohocken, Pa., US.

| Glass Example | Young's Modulus (GPa) | Poisson's ratio | CTE ($\times 10^{-7}$/° C.): | Bow, $\mu$m |
|---|---|---|---|---|
| Alkali Aluminosilicate A | 65.79 | 0.22 | 86.9 | 17.9 |
| Alkali Aluminosilicate B | 71.70 | 0.21 | 83.0 | 407.0 |
| Alkali Aluminosilicate C | 68.02 | 0.22 | 76.0 | 917.0 |

Method

A second aspect of this disclosure pertains to a method of vacuum depositing a coating on a surface of a glass substrate. In one or more embodiments, the method includes disposing a carrier and a glass substrate on an ESC, such that the carrier is between the glass substrate and the ESC to form a chucking assembly, and forming a Van der Waals bond between the carrier and the glass substrate. In one or more embodiments, the method includes vacuum depositing a coating on the glass substrate.

In one or more embodiments, carrier comprises opposing first and second surfaces (22, 24 in FIG. 1), and the glass substrate comprises opposing third and fourth surfaces (32, 34 in FIG. 1), and forming of the Van der Waals bond is performed between the second surface (24 in FIG. 1) and the third surface (32 in FIG. 1). In other words, the resulting Van der Waals bond is between the second surface (24 in FIG. 1) and the third surface (32 in FIG. 1). In one or more embodiments, the Van der Waals bond comprises a bond strength in a range from about 100 mg/cm$^2$ to 700 mg/cm$^2$.

In one or more embodiments, forming the Van der Waals bond comprises cleaning the second surface and the third surface, before forming the bond (as illustrated in FIGS. 5-8). Without being bound by theory, it is believed that such cleaning removes organics and particulates which would otherwise prevent the formation of Van der Waals bonding by maintaining a separation between the two surfaces.

In one or more embodiments, the second surface is cleaned before disposing the carrier and the glass substrate on the ESC. In some embodiments, the carrier is disposed on the ESC and the glass substrate is sequentially disposed on the carrier, and wherein the second surface is cleaned after disposing the carrier on the ESC and before the glass substrate is placed on the carrier.

Figure 5:
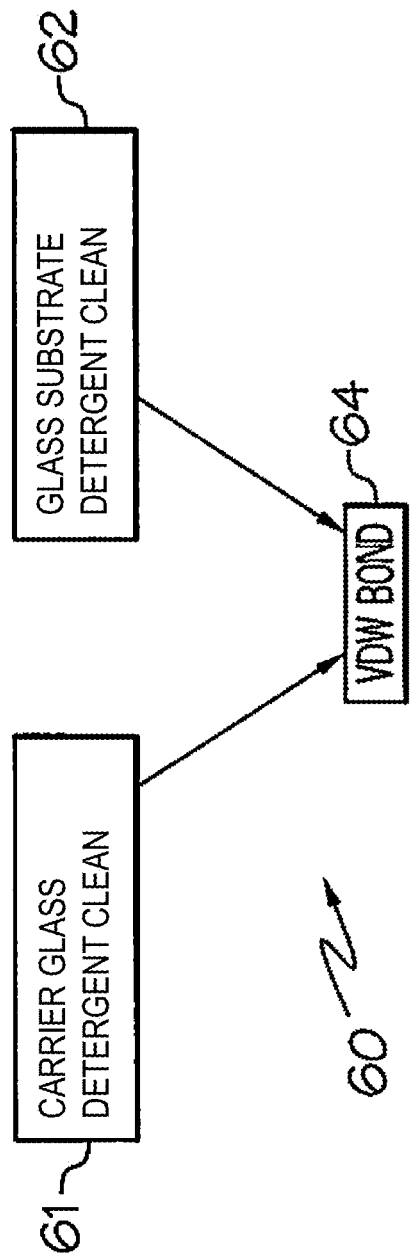
FIG. 5 is a schematic diagram of a first cleaning process for using the chucking apparatus of FIG. 1.

As depicted in FIG. 5, the carrier and the glass substrate may be cleaned in separate steps according to process 60. The carrier may be cleaned with a detergent prior to bonding at step 61. The glass substrate may be subjected to the same or different detergent cleaning process at step 62. The cleaned glass substrate and carrier are then brought into contact (as described herein) for forming the Van der Waals bond at step 64.

Figure 6:
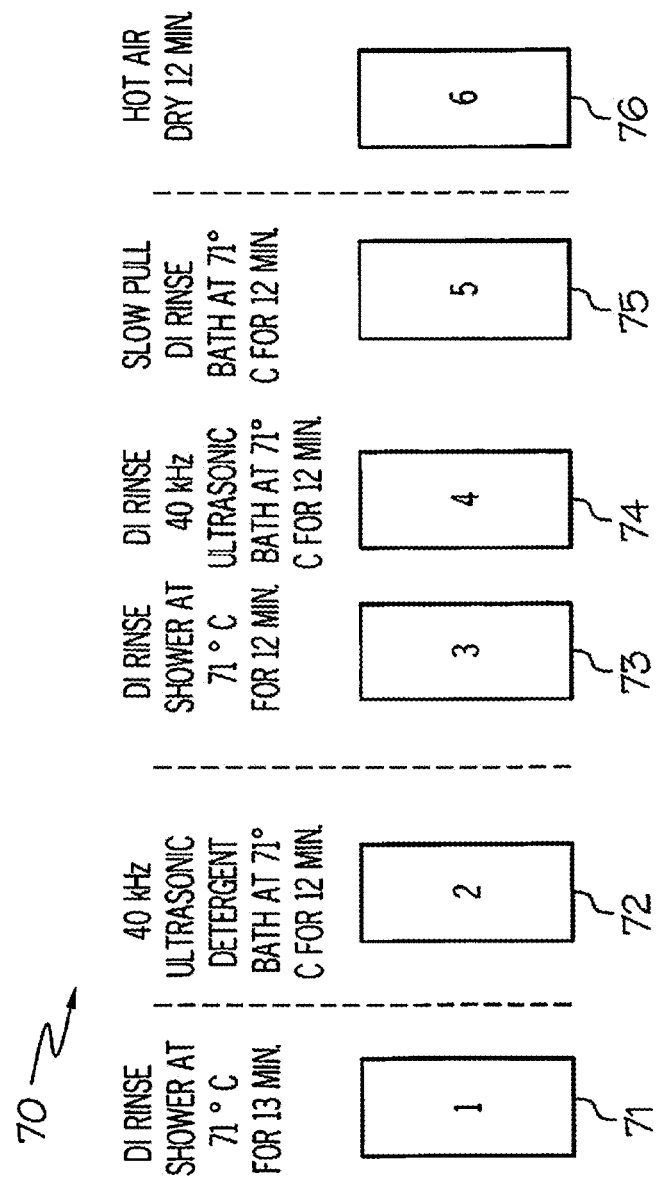
FIG. 6 is a schematic diagram of a detergent cleaning step of the cleaning process of FIG. 5.

FIG. 6 illustrates the details of an exemplary detergent cleaning method 70 that may be used to clean one or both of the glass substrate and the carrier (61, 62), in steps 71-76. Step 71 represents a de-ionized water rinse shower at a temperature in a range from about 65° C. to about 75° C. (e.g., about 71° C.) for a duration in a range from about 10 minutes to about 20 minutes (e.g., about 13 minutes). Step 72 represents a 40 kHz ultrasonic detergent bath at a temperature in a range from about 65° C. to about 75° C. (e.g., about 71° C.) for a duration in a range from about 10 minutes to about 20 minutes (e.g., about 12 minutes). Step 73 represents a de-ionized water rinse shower at a temperature in a range from about 65° C. to about 75° C. (e.g., about 71° C.) for a duration in a range from about 10 minutes to about 20 minutes (e.g., about 12 minutes). Step 74 represents a second 40 kHz ultrasonic detergent bath at a temperature in a range from about 65° C. to about 75° C. (e.g., about 71° C.) for a duration in a range from about 10 minutes to about 20 minutes (e.g., about 12 minutes). Step 75 represents a slow pull de-ionized water rinse bath at a temperature in a range from about 65° C. to about 75° C. (e.g., about 71° C.) for a duration in a range from about 10 minutes to about 20 minutes (e.g., about 12 minutes). Step 76 represents a forced hot air drying step for a duration in a range from about 10 minutes to about 20 minutes (e.g., about 12 minutes). Other combinations of rinsing, detergent, and drying steps, at different temperatures and different durations, may be successfully utilized, as determined by one of ordinary skill in the art.

Figure 7:
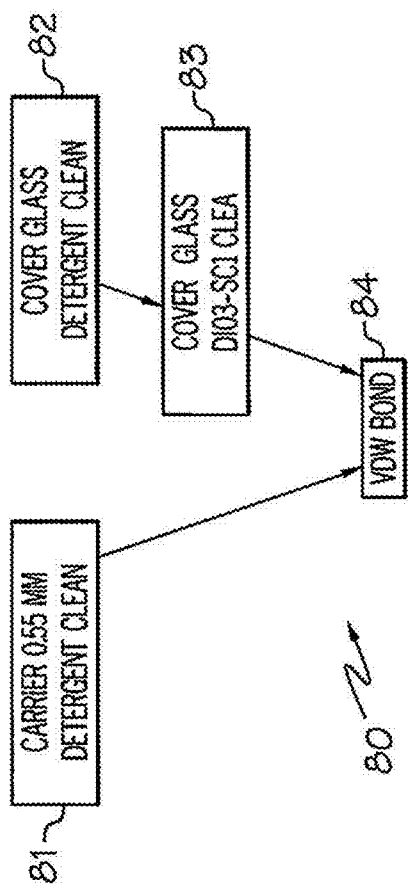
FIG. 7 is a schematic diagram of a second cleaning process for using the chucking apparatus of FIG. 1.
Figure 8:
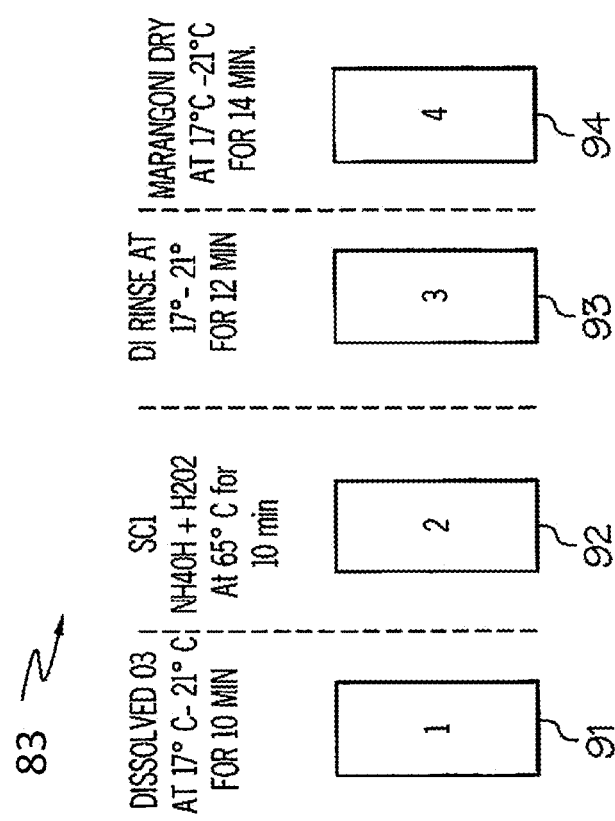
FIG. 8 is a schematic diagram of a cleaning step of the cleaning process of FIG. 7.

In one or more embodiments, either one or both the glass substrate and the carrier may be subjected to additional cleaning. Accordingly, the method according to one or more embodiments includes cleaning the glass substrate and/or the carrier again (after cleaning with a detergent as shown in FIGS. 5-6), using a dissolved ozone and a surface cleaning process. These additional cleaning steps are shown in FIGS. 7-8. As shown in FIG. 7, the method includes further cleaning the glass substrate (already detergent cleaned) 82 using a second cleaning step 83. For example, the cleaning step 83 may include a Standard Clean 1 (SC1) cleaning as is known in the art. As illustrated in FIG. 8, the second cleaning step 83 includes step 91, which includes dissolving ozone in de-ionized water and providing the combination at a temperature in a range from about 15° C. to about 25° C. (e.g., 17° C. to 21° C.), and immersing the glass substrate therein for a duration in a range from about 5 minutes to about 15 minutes (e.g., 10 minutes). At step 92, the method includes providing a combination of $NH_4OH+H_2O_2$ having a temperature in a range from about 60° C. to about 70° C. (e.g., about 65° C.) and immersing the glass substrate therein for a duration in a range from about 5 minutes to about 15 minutes (e.g., 10 minutes). Step 93 represents rinsing the glass substrate in de-ionized water having a temperature in a range from about 15° C. to about 25° C. (e.g., 17° C. to 21° C.) for a duration in a range from about 5 minutes to about 15 minutes (e.g., 12 minutes). Finally, step 94 represents a drying step (for example a Marangoni Dry, as is known in the art) wherein the glass substrate is dried at a temperature in a range from about 15° C. to about 25° C. (e.g., 17° C. to 21° C.) for a duration in a range from about 5 minutes to about 15 minutes (e.g., 14 minutes). Other combinations of rinsing, detergent, and drying steps, at different temperatures and different durations, may be successfully utilized, as determined by one of ordinary skill in the art.

In one or more embodiments, one or both the glass substrate and the carrier are modified or treated to facilitate formation of the Van der Waals bond. For example, the method may include imparting a surface roughness (Ra and Rq) on the second surface or the third surface of less than about 0.6 nanometers (e.g., less than about 0.55 nm, less than about 0.5 nm, less than about 0.45 nm, less than about 0.4 nm), over an area having dimensions of 1 mm by 1 mm. Unless specified otherwise, the surface roughness is measured over an area having dimensions of 1 mm by 1 mm. The lower limit of the surface roughness may be about 0.1 nm or 0.2 nm.

In some embodiments, the method may include imparting a flatness of less than 60 micrometers (e.g., 55 micrometers or less, 50 micrometers or less, 45 micrometers or less, or about 40 micrometers or less) on the second surface, over an area having dimensions of 1 mm by 1 mm. The lower limit of flatness may be about 10 micrometers or 20 micrometers.

In one or more embodiments, the method may include imparting a flatness of less than 80 micrometers (e.g., less than about 75 micrometers, less than about 70 micrometers, or less than about 60 micrometers) on the third surface, over an area having dimensions of 1 mm by 1 mm. The lower limit of flatness for the second surface and the third surface may be about 20 nanometers.

Without being bound by theory, it is believed that the selection of surface roughness is helpful to provide a desired degree of contact between the glass substrate molecules and the carrier molecules so as to yield sufficient Van der Waals bonding. However, the surface roughness should not be too smooth, otherwise permanent bonding can occur. Thus, the surface roughness should be chosen to be rough enough to prevent permanent bonding at the elevated process temperature, but smooth enough to result in temporary Van der Waals bonding. In one example, a glass substrate having an alkali aluminosilicate glass composition may be treated or otherwise modified to provide a surface roughness of Rq=0.59 nm and Ra=0.47 nm and its flatness is less than 80 μm.

In one or more embodiments, forming the Van der Waals bond between the carrier and the glass substrate includes contacting the second and third surfaces thereof, and energizing the ESC to secure the glass substrate to the carrier, and to secure the carrier to the ESC. In some embodiments, the method includes energizing the ESC with an electric voltage in a range from about 500 volts DC to about 3500 volts DC. In some embodiments, the method includes forming the Van der Waals bond by energizing the ESC to apply a clamping force to the chucking assembly in a range from about 3 $gf/cm^2$ and 10 $gf/cm^2$. In one or more embodiments, the method includes forming the Van der Waals bond without application of a mechanical force on the fourth surface (34, FIG. 1). In some embodiments, the method includes forming the Van der Waals bond without applying a mechanically force to the glass substrate.

In one or more embodiments, the method includes a chucking assembly disposed on a carrier plate and the carrier plate is disposed in a vacuum deposition chamber. In some instances, the carrier plate comprises a plurality of chucking assemblies. After vacuum depositing a coating on the glass substrate, the method according to one or more embodiments includes de-energizing the ESC; and removing the Van der Waals-bonded cover glass and carrier from the ESC.

In one or more embodiments, the contact area over which the Van der Waals bond is formed may form a portion of the total surface area of the glass substrate (as illustrated in FIG. 2, FIGS. 9A-9B, and 10A-10B). In some embodiments, the contact area may be smaller than the total available surface area of the glass substrate depending on the mass of the glass substrate and the desired bond strength to keep it bonded during the vacuum deposition coating process. A larger contact area requires a greater force between the carrier and the glass substrate during the vacuum deposition coating step. For example, when a glass substrate 30 has differing masses (e.g., a mass of about 7.9 g or a mass of about 18 g), the required force of the bond between the glass substrate and the carrier will differ. When such glass substrates are coated using a vacuum deposition process in a vacuum deposition chamber having a rotatable wall in a drum configuration, the rotatable wall may have a diameter of 1.5 m and may spin at 100 RPM. The circumference is then 4.7 m and the rotations per second (RPS)=100/60=1.7 RPS. This yields a velocity, v=4.7 m/1.7 RPS=2.8 m/s, which is the linear velocity. The centrifugal force is then:

For the 7.9 g glass substrate:

$$F_c = m(n\omega/60)^2/r = 7.9 \times 10^{-3} \text{ kg}(100*2*\pi*0.75 \text{ m}/60)^2/0.75 \text{ m} = 0.65 \text{ N}$$

If the contact area is 5.5 cm×10 cm or 55 $cm^2$, then the area=0.0055 $m^2$ then, 0.65 N/0.0055 $m^2$=118.2 $N/m^2$=1.21 $g/cm^2$, which is the minimum bond strength required to hold the glass substrate to the carrier as the chucking assembly spins on the outside of a 1.5 m diameter drum rotating at 100 RPM.

For the 18 g glass substrate:

$$F_c = m(n\omega/60)^2/r = 18.0 \times 10^{-3} \text{ kg}(100 \cdot 2 \cdot \pi \cdot 0.75 \text{ m}/60)^2/0.75 \text{ m} = 1.48 \text{ N}.$$

If the contact area is 7 cm×12 cm or 84 cm² then the area=0.0084 m² then 1.48N/0.0084 m²=176.2 N/m²=1.8 g/cm², is the minimum bond strength required to hold the glass substrate to the carrier as the chucking assembly spins on the outside of a 1.5 m diameter drum rotating at 100 RPM.

If the contact area between the carrier and the glass substrate is reduced, the required clamping force per square should be increased. Likewise, if the mass of the glass substrate is increased but the contact area remains the same, then the required clamping force per square area should also be increased.

To achieve the increased bonding strength, the contact area can be increased, combined perhaps with a change in carrier surface roughness (smoothing will increase the bonding strength) and carrier flatness (provides more uniform contact). These are three variables that can be adjusted to increase or decrease the Van der Waals bond strength as required by the particular coating process speed (and in particular the rotation speed in a some vacuum processes), mass of the glass substrate, and available glass substrate flat area for bonding.

EXAMPLES

Figure 10A:
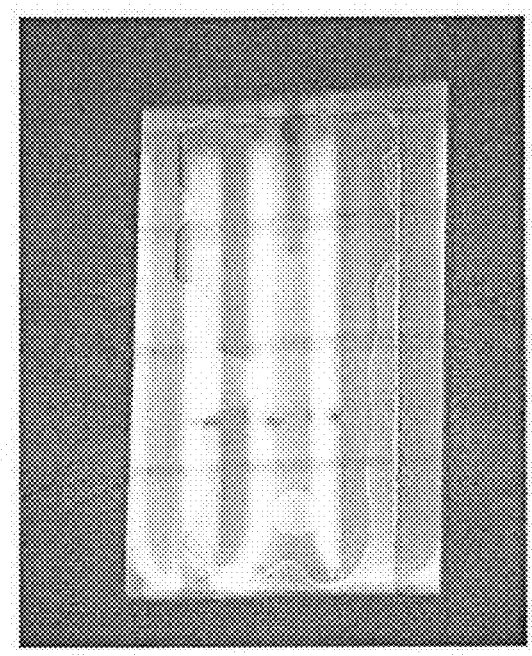
FIGS. 10A and 10B are images of experimental test results showing the extent of Van der Waals bonding, with diffraction ring regions depicting non-bonded regions.
Figure 10B:
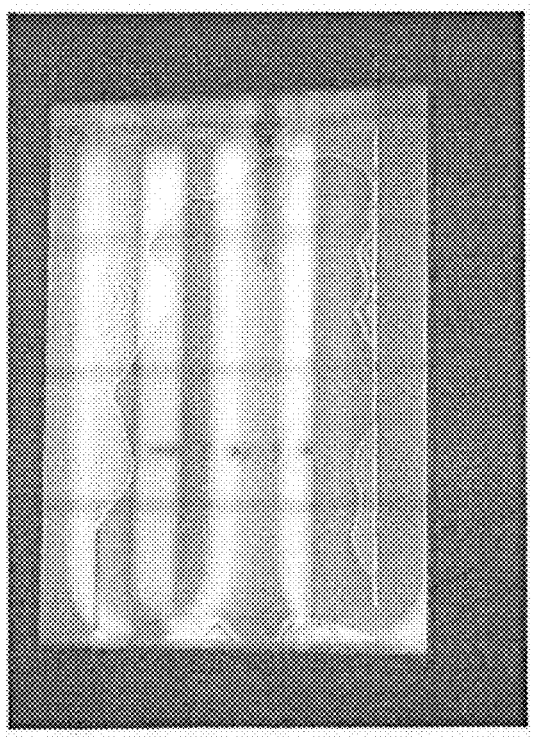

FIGS. 10A and 10B illustrate experimental test results of a glass substrate in contact with a carrier. The dark regions of FIGS. 10A and 10B indicate the presence of Van der Waals bonding Example 1

Two sheets of aluminosilicate glass having at thickness of 0.1 μm each were placed on an ESC. A first glass sheet was the carrier and the second glass sheet was the glass substrate to be coated using a vacuum deposition process. After energizing the ESC, Van der Waals bonds starting to form and were observed as illustrated in FIG. 10A.

Example 2

Two glass sheets having identical alkali aluminosilicate glass compositions were placed on an ESC. A 500 VDC was applied to energize the ESC. Van der Waals bonding was formed and observed without any application of force on the glass substrate other than the electrostatic field. as illustrated in FIG. 10B.

While the invention has been described in terms of preferred illustrative embodiments, those skilled in the art will appreciate that various changes, additions, deletions, and modifications can be made therein without departing from the spirit and scope of the invention as defined in the appended claims. Some non-limiting embodiments include the following.

Embodiment 1. A chucking apparatus for coating a glass substrate using a vacuum deposition process, the apparatus comprising:
an electrostatic chuck (ESC);
a carrier disposed on the ESC, wherein the carrier comprises a first surface adjacent to the ESC and an opposing second surface for forming a Van der Waals bond with a third surface of a glass substrate, without application of a mechanical force on a fourth surface of the glass substrate opposing the third surface.

Embodiment 2. The apparatus of embodiment 1, wherein the Van der Waals bond is formed without application of a mechanical force on the glass substrate.

Embodiment 3. The apparatus of embodiment 1 or embodiment 2, wherein the ESC is adapted to apply a clamping force in a range from about 3 gf/cm² and 10 gf/cm².

Embodiment 4. The chucking apparatus of any one of embodiments 1-3, wherein the glass substrate comprises a first coefficient of thermal expansion and the carrier comprises a second coefficient of thermal expansion that is within 10% of the first coefficient of thermal expansion.

Embodiment 5. The chucking apparatus of embodiment 4, wherein the first coefficient of thermal expansion and the second coefficient of thermal expansion are substantially equal.

Embodiment 6. A method of vacuum depositing a coating on a surface of a glass substrate, the method comprising:
disposing a carrier and a glass substrate on an electrostatic (ESC), such that the carrier is between the glass substrate and the ESC to form a chucking assembly;
forming a Van der Waals bond between the carrier and the glass substrate; and
vacuum depositing a coating on the glass substrate.

Embodiment 7. The method of embodiment 6, wherein forming the Van der Waals bond comprises energizing the ESC to secure the glass substrate to the carrier, and to secure the carrier to the ESC.

Embodiment 8. The method of embodiment 6 or embodiment 7, wherein the carrier comprises opposing first and second surfaces, and the glass substrate comprises opposing third and fourth surfaces, wherein the Van der Waals bond is formed between the second surface and the third surface.

Embodiment 9. The method of embodiment 8, wherein forming the Van der Waals bond comprises cleaning the second surface and the third surface.

Embodiment 10. The method of embodiment 9, wherein the second surface is cleaned before disposing the carrier and the glass substrate on the ESC.

Embodiment 11. The method of embodiment 10, further comprising disposing the carrier on the ESC and disposing the glass substrate sequentially on the carrier, and wherein the second surface is cleaned after disposing the carrier on the ESC and before the glass substrate is placed on the carrier.

Embodiment 12. The method of any one of embodiments 7-11, further comprising de-energizing the ESC; and removing the Van der Waals-bonded cover glass and carrier from the ESC.

Embodiment 13. The method of any one of embodiments 6-12, wherein the Van der Waals bond comprises a bond strength in a range from about 100 mg/cm² to 700 mg/cm².

Embodiment 14. The method of any one of embodiments 6-13, wherein the second surface comprises a surface roughness of less than about 0.6 nanometers and a flatness of less than 60 micrometers, over an area having dimensions of 1 mm by 1 mm, and the third surface comprises a flatness of less than 80 micrometers, over an area having dimensions of 1 mm by 1 mm.

Embodiment 15. The method of any one of embodiments 7-14, further comprising energizing the ESC with an electric voltage in a range from about 500 volts DC to about 3500 volts DC.

Embodiment 16. The method of any one of embodiments 6-15, further comprising forming the Van der Waals bond without application of a mechanical force on the fourth surface.

Embodiment 17. The method of embodiment 16, further comprising forming the Van der Waals bond without applying a mechanically force to the glass substrate.

Embodiment 18. The method of any one of embodiments 6-17, wherein forming the Van der Waals bond comprises energizing the ESC to apply a clamping force to the chucking assembly in a range from about 3 gf/cm² and 10 gf/cm².

Embodiment 19. The method of any one of embodiments 6-18, further comprising disposing the chucking assembly on a carrier plate and disposing the carrier plate in a vacuum deposition chamber.

Embodiment 20. The method of embodiment 19, wherein the carrier plate comprises a plurality of chucking assemblies.

The invention claimed is:

1. A chucking apparatus for coating a glass substrate using a vacuum deposition process, the apparatus comprising:
   an electrostatic chuck (ESC);
   a carrier disposed on the ESC, wherein the carrier comprises a first surface adjacent to the ESC and an opposing second surface for forming a Van der Waals bond with a third surface of a glass substrate, without application of a mechanical force on a fourth surface of the glass substrate opposing the third surface, and
   wherein at least one of the second surface and third surface comprises a surface roughness Ra of from about 0.1 nm to less than 0.6 nm.

2. The apparatus of claim 1, wherein the Van der Waals bond is formed without application of a mechanical force on the glass substrate.

3. The apparatus of claim 1, wherein the ESC is adapted to apply a clamping force in a range from about 3 gf/cm² and 10 gf/cm².

4. The chucking apparatus of claim 1, wherein the glass substrate comprises a first coefficient of thermal expansion and the carrier comprises a second coefficient of thermal expansion that is within 10% of the first coefficient of thermal expansion.

5. The chucking apparatus of claim 4, wherein the first coefficient of thermal expansion and the second coefficient of thermal expansion are substantially equal.

* * * * *